United States Patent [19]

Hadjifotiou

[11] Patent Number: 5,355,248

[45] Date of Patent: Oct. 11, 1994

[54] OPTICAL AMPLIFIER

[75] Inventor: Anagnostis Hadjifotiou, Harlow, United Kingdom

[73] Assignee: Northern Telecom Limited, Montreal, Canada

[21] Appl. No.: 145,780

[22] Filed: Oct. 29, 1993

[30] Foreign Application Priority Data

Oct. 30, 1992 [GB]  United Kingdom ............. 9222834.5

[51] Int. Cl.⁵ ............................................. G02B 6/26
[52] U.S. Cl. ................................... 359/341; 359/345
[58] Field of Search ................. 359/341, 345; 372/6

[56] References Cited

U.S. PATENT DOCUMENTS 4,699,452 10/1987 Mollenauer et al. ................ 359/341
5,058,974 10/1991 Mollenauer ..................... 359/341 X
5,291,326  3/1994 Heidemann ......................... 359/160

FOREIGN PATENT DOCUMENTS 0387075 9/1990 European Pat. Off. .
0459685 9/1992 European Pat. Off. .
2253514 9/1992 United Kingdom .

*Primary Examiner*—Mark Hellner
*Attorney, Agent, or Firm*—Lee, Mann, Smith, McWilliams, Sweeney & Ohlson

[57] ABSTRACT

A diode-pumped fiber amplifier has its amplifying fiber divided into two parts so that light from both ends of a laser diode can be used for pumping. A second diode may be included for redundancy, its outputs being coupled via a pair of polarisation beam splitter/combiners.

4 Claims, 2 Drawing Sheets

OPTICAL AMPLIFIER

BACKGROUND TO THE INVENTION

This invention relates to diode-pumped optical amplifiers.

A conventional injection laser diode emits light from both the front end facet and the rear end facet. Normally however it is only the light emitted from the front facet that is made available for use in the world outside the laser package, while that emitted from the rear facet is employed internally of the package for monitoring purposes. In certain types of laser chip the construction is designed such that much more light is emitted from the front facet than from the rear, but the most basic design provides substantially the same power from both facets. An injection laser diode has a number of advantages as an optical source for pumping an optical amplifier, but the fact that much of its power is not used for pumping, because it is emitted from the rear facet of the diode, is not one of those advantages.

SUMMARY OF THE INVENTION

The present invention is directed to constructions of diode-pumped optical amplifiers in which optical power emitted from both end facets is utilised for optical pumping. Such constructions are particularly of use when employing diodes that emit substantially equal amounts of power from both end facets.

According to the present invention there is provided a diode-pumped optical amplifier, which amplifier includes an optical pump source in the form of an injection laser diode having first and second end facets from which optical pump power is emitted, and including an optically amplifying waveguided transmission medium formed in two parts optically in series with each other, wherein the optical output from the first end facet of the laser diode is optically coupled with the first part of the waveguided transmission medium while the optical output from the second end facet is optically coupled with the second part.

Preferably the optically amplifying waveguided transmission medium takes the form of optically amplifying fibre.

The division of the optically amplifying fibre into two portions allows the incorporation of wavelength multiplexing couplers between the two portions which can be used to inhibit the stimulation of laser modes that have an optical cavity threading the optical fibre.

The injection laser optical pump source may be accompanied by a second injection laser optical pump source provided for redundancy purposes, the outputs of the two lasers being combined by means of polarisation beam splitter/combiners.

The wavelength multiplexing couplers and the polarisation beam splitter/combiners may be constructed in optical fibre format, or may alternatively be constructed in integrated optics waveguide using for instance silica on silicon technology.

BRIEF DESCRIPTION OF THE DRAWINGS

There follows a description of diode-pumped optical fibre amplifiers embodying the invention in preferred forms. The description refers to the accompanying drawings in which.

DETAILED DESCRIPTION OF PREFERRED EMBODIMENTS

Figure 1:
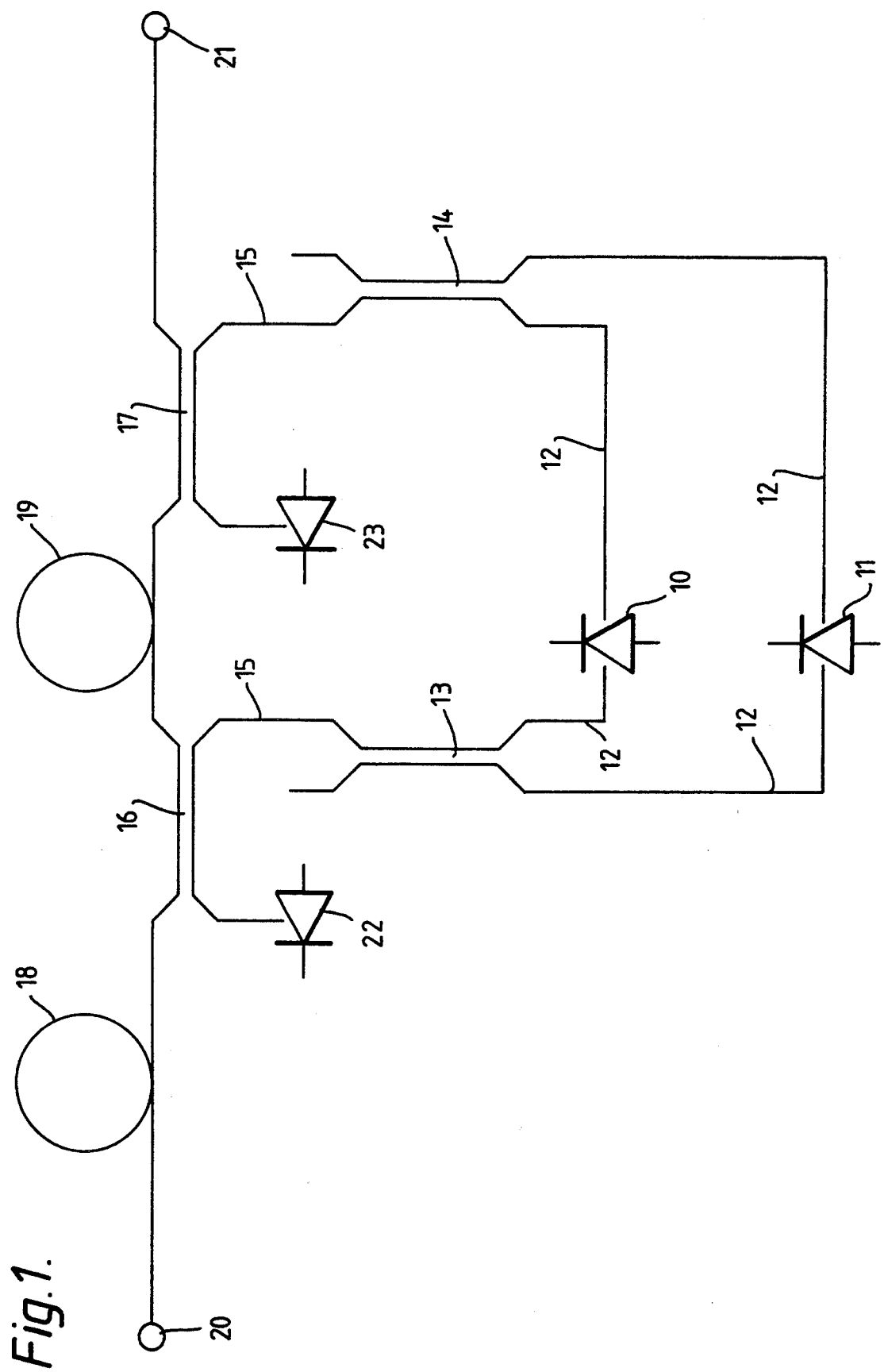
FIGS. 1 and 2 are schematic diagrams of two different configurations of amplifier each incorporating optical pump redundancy.

Referring to FIG. 1, first and second injection laser diodes 10, 11 emitting at a common pump wavelength are coupled by means of four lengths 12 of single mode fibre with two optical fibre polarisation beam splitter/combiners 13, 14. In respect of each of the lasers 10 and 11, one of the four lengths 12 of single mode fibre is optically coupled with one end facet of that laser while another of those four lengths is coupled with the other end facet. The arrangement of the lasers 10, 11 and the coupling fibres 12, which may be constructed of polarisation preserving fibre, in relation to the principal axes of the polarisation beam splitter/combiners 13, 14 is such that light from both lasers is, in both instances, coupled into the same output port. These two respective output ports are optically coupled by two further coupling lengths 15 of single mode fiber with two wavelength multiplexing beam splitter/combiners 16, 17. These two wavelength multiplexing beam splitter/combiners are constructed to multiplex a wavelength close to the pump wavelength with a signal wavelength, this signal wavelength being a wavelength at which amplification occurs in two lengths 18, 19 of optically amplifying fibre, typically erbium-doped fibre, when pumped with light at the pump wavelength.

The amplifier of FIG. 1 has an optical input port and an optical output port, interchangeably ports 20 and 21. Between these two ports the two multiplexing beam splitter/combiners 16, 17 and the two lengths 18, 19 of amplifying fibre are connected optically in series in an interleaved configuration so that light at the signal wavelength launched into port 20 passes substantially totally undeviated to port 21. At the same time the majority of light from polarisation beam splitter/combiner 13 is transmitted by the multiplexing beam splitter/combiner 16 to amplifying fibre 18, leaving a residual portion to be detected by a photodetector 22, and similarly the majority of light from polarisation beam splitter/combiner 14 is transmitted by multiplexing beam splitter/combiner 17 to amplifying fibre 19, leaving a residual portion to be detected by a photodetector 23.

The electrical outputs of the two photodetectors can be used in the same way as conventional monitor photodiodes for diode lasers are used to regulate the drive or applied to the laser diodes 10, 11 to take account of changes in their conversion efficiency resulting for instance from changes in temperature and the effects of ageing processes. In fact, since the two laser diodes are not simultaneously operated, the second one being energised only when the first has failed, or deteriorated too much, there..is no need to employ both photodetectors 22, 23, since the output of just one of them can be used to regulate both drives in turn. It will be appreciated that if one of the photodetectors 22 or 23 is dispensed with, then its associated multiplexing beam splitter/combiner 16 or 17 can with advantage be arranged to multiplex at the wavelength of the pump, rather than at a wavelength close to the pump wavelength, since there is no requirement for it to divert any of the pump power away from the associated amplifying fibre 18 or 19 for monitoring purposes.

Figure 2:
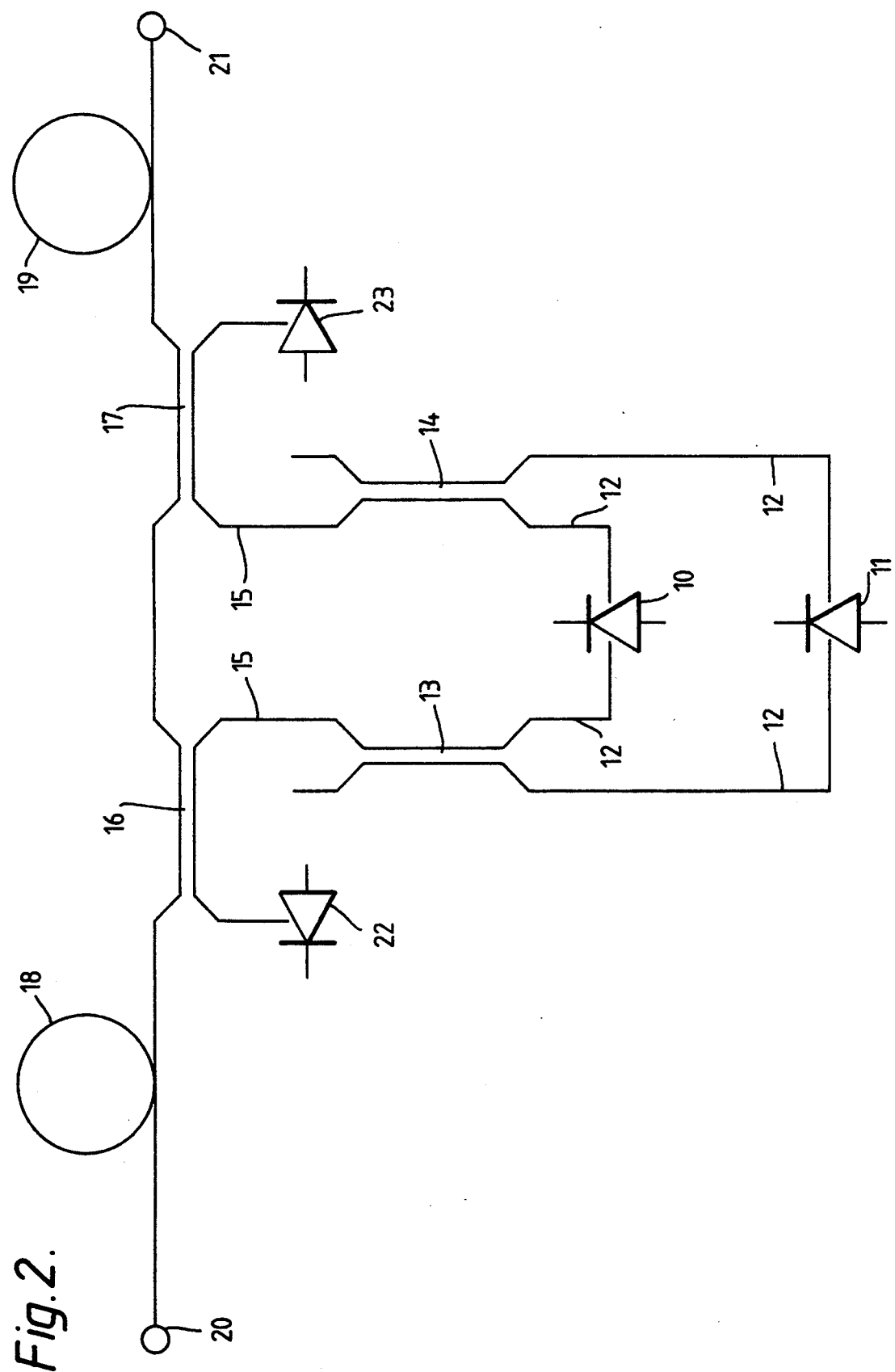

Turning attention now to FIG. 2, this amplifier uses the same components as the amplifier of FIG. 1, but with a slightly different layout. The difference concerns the arrangement of the multiplexing beam splitter/combiners 16, 17 and the amplifying fibres 18, 19. In the arrangement of FIG. 2 both multiplexing beam splitter/combiners 16, 17 are located between the two amplifying fibres 18, 19. This means that the configuration is a Counter-; Co-pumping configuration, whereas that of FIG. 1 is a Co-; Co- pumping configuration, or a Counter-; Counter- pumping configuration, according to whether port 20 or port 21 is employed as the input port.

I claim:

1. A diode-pumped optical amplifier, which amplifier includes an optical pump source in the form of an injection laser diode having first and second end facets from which optical pump power is emitted, and including an optically amplifying waveguided transmission medium formed in two parts optically in series with each other, wherein the optical output from the first end facet of the laser diode is optically coupled with the first part of the waveguided transmission medium while the optical output from the second end facet is optically coupled with the second part.

2. A diode-pumped optical fibre amplifier as claimed in claim 1, wherein the optically amplifying waveguided transmission medium takes the form of optically amplifying fibre.

3. A diode-pumped optical fibre amplifier as claimed in claim 1, wherein the optical outputs for the first end facet and the second end facet of a second injection laser diode are coupled with those of the first injection laser diode by means of two polarisation beam splitter/combiners.

4. A diode-pumped optical fibre amplifier as claimed in claim 3, wherein the optically amplifying waveguided transmission medium takes the form of optically amplifying fibre.

* * * * *